United States Patent
Hammond

(10) Patent No.: US 8,680,955 B1
(45) Date of Patent: Mar. 25, 2014

(54) THERMALLY NEUTRAL ANCHOR CONFIGURATION FOR AN ELECTROMECHANICAL ACTUATOR

(75) Inventor: Jonathan Hale Hammond, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 312 days.

(21) Appl. No.: 12/710,195

(22) Filed: Feb. 22, 2010

Related U.S. Application Data

(60) Provisional application No. 61/154,238, filed on Feb. 20, 2009, provisional application No. 61/156,965, filed on Mar. 3, 2009.

(51) Int. Cl.
*H01H 51/22* (2006.01)

(52) U.S. Cl.
USPC ............................................ 335/78; 200/181

(58) Field of Classification Search
USPC ............................................ 335/78; 200/181
See application file for complete search history.

(56) References Cited

U.S. PATENT DOCUMENTS

| | | | |
|---|---|---|---|
| 5,658,698 A | 8/1997 | Yagi et al. | |
| 6,127,908 A | 10/2000 | Bozler et al. | |
| 6,153,839 A * | 11/2000 | Zavracky et al. | 200/181 |
| 6,469,602 B2 | 10/2002 | Ruan et al. | |
| 6,625,004 B1 | 9/2003 | Musolf et al. | |
| 6,639,494 B1 | 10/2003 | Bluzer | |
| 6,777,765 B2 | 8/2004 | Chen et al. | |
| 6,835,589 B2 | 12/2004 | Pogge et al. | |
| 7,053,737 B2 | 5/2006 | Schwartz et al. | |
| 7,071,031 B2 | 7/2006 | Pogge et al. | |
| 7,135,766 B1 | 11/2006 | Costa et al. | |
| 7,605,675 B2 * | 10/2009 | Bar et al. | 333/105 |
| 7,956,709 B2 | 6/2011 | Watanabe et al. | |
| 7,999,635 B1 | 8/2011 | Quevy et al. | |
| 7,999,643 B1 | 8/2011 | Dening et al. | |
| 8,018,308 B2 | 9/2011 | Kwon et al. | |
| 8,159,056 B1 * | 4/2012 | Kim et al. | 257/678 |
| 2003/0058069 A1 | 3/2003 | Schwartz et al. | |
| 2005/0048687 A1 | 3/2005 | Tatic-Lucic | |
| 2005/0183938 A1 | 8/2005 | Chou | |
| 2006/0012014 A1 | 1/2006 | Chen et al. | |

(Continued)

OTHER PUBLICATIONS

De Silva, A.P. et al., "Motorola MEMS switch technology for high frequency applications," 2001 Microelectromechanical Systems Conference, 2001, pp. 22-24, IEEE.

(Continued)

*Primary Examiner* — Bernard Rojas
(74) *Attorney, Agent, or Firm* — Withrow & Terranova, P.L.L.C.

(57) ABSTRACT

A micro-electromechanical systems (MEMS) switch having a thermally neutral anchor configuration is provided. The MEMS switch includes a substrate onto which a first conductive pad and a second conductive pad are formed. A first conductive pad anchor is coupled to the first conductive pad and a second conductive anchor spaced from the first conductive anchor is also coupled to the first conductive pad. A conductive cantilever beam has a first end portion that is situated between and coupled to the first and second conductive anchors. Moreover, the conductive cantilever beam has a second end portion that is suspended over the second conductive pad, and a middle portion between the first end portion and the second end portion. The MEMS switch also includes a conductive actuator plate formed on the substrate at a location beneath the middle portion of the conductive cantilever beam and between the first and second conductive pads.

13 Claims, 10 Drawing Sheets

(56) References Cited

U.S. PATENT DOCUMENTS

| | | | |
|---|---|---|---|
| 2006/0108675 | A1 | 5/2006 | Colgan et al. |
| 2006/0181379 | A1 | 8/2006 | Schwartz et al. |
| 2006/0254345 | A1* | 11/2006 | King et al. ............... 73/105 |
| 2007/0103028 | A1 | 5/2007 | Lewis et al. |
| 2007/0172975 | A1 | 7/2007 | Tomomatsu et al. |
| 2007/0202626 | A1* | 8/2007 | Liu ............... 438/48 |
| 2007/0281381 | A1 | 12/2007 | Ayazi |
| 2007/0290773 | A1* | 12/2007 | Bar et al. ............... 333/262 |
| 2008/0164542 | A1 | 7/2008 | Yang et al. |
| 2009/0321857 | A1* | 12/2009 | Foster et al. ............... 257/415 |
| 2010/0038730 | A1 | 2/2010 | Sandhu et al. |
| 2010/0127172 | A1 | 5/2010 | Nikoobakht |

OTHER PUBLICATIONS

Notice of Allowance for U.S. Appl. No. 13/707,084, mailed Jun. 21, 2013, 9 pages.
Notice of Allowance for U.S. Appl. No. 12/779,307, mailed Jun. 19, 2013, 10 pages.
Notice of Allowance for U.S. Appl. No. 13/707,084 mailed Apr. 11, 2013, 9 pages.
Non-final Office Action for U.S. Appl. No. 12/779,307 mailed Dec. 9, 2011, 7 pages.
Final Office Action for U.S. Appl. No. 12/779,307 mailed Jul. 11, 2012, 9 pages.
Advisory Action for U.S. Appl. No. 12/779,307 mailed Aug. 28, 2012, 3 pages.
Non-final Office Action for U.S. Appl. No. 12/779,307 mailed Oct. 23, 2012, 9 pages.
Notice of Allowance for U.S. Appl. No. 12/779,307 mailed Mar. 5, 2013, 10 pages.
Notice of Allowance for U.S. Appl. No. 12/709,979 mailed Sep. 10, 2012, 9 pages.
Notice of Allowance for U.S. Appl. No. 12/710,108 mailed Jul. 13, 2010, 8 pages.
Costa, J. et al., "Integrated MEMS Switch Technology on SOI-CMOS," Proceedings of Hilton Head Workshop 2008: A Solid-State Sensors, Actuators and Microsystems Workshop, Jun. 2008, 4 pages.
Costa, J. et al., "A Silicon RFCMOS SOI Technology for Integrated Cellular/WLAN RF TX Modules," Proceedings of the IEEE MTS Microwave Symposium, Jun. 2007, pp. 445-448, IEEE.

Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.
Joseph, Alvin et al., "A 0.35 um SiGe BiCMOS Technology for Power Amplifier Applications," IEEE BCTM Conference Proceedings, Sep. 30-Oct. 2, 2007, pp. 198-201, IEEE.
Kelly, Dylan et al., "The State-of-the-Art of Silicon-on-Sapphire CMOS RF Switches," Proceedings of the IEEE Compound Semiconductor Symposium, Oct. 30-Nov. 2, 2005, pp. 200-205.
Mazure, Carlos et al., "Engineering Wafers for the Nanotechnology Era," Proceedings of ESSCIRC, Sep. 2005, pp. 29-38, IEEE.
Shokrani, Mohsen et al., "InGap-Plus(TM): A Low Cost Manufacturable GaAs BiFET Process Technology," Proceedings of the GaAs Mantech Conference, Nov. 2006, pp. 153-156.
Tinella, C. et al., "0.13um CMOS SOI SP6T Antenna Switch for Multi-Standard Handsets," Topic Meeting on Silicon Monolithic Circuits in RF Systems, Jan. 2006, pp. 58-61, IEEE.
Tombak, Ali et al., "A Flip-Chip Silicon IPMOS Power Amplifier and a DC/DC Converter for GSM 850/900/1800/1900 MHz Systems," Proceedings of the IEEE Radio Frequency Integrated Circuits Symposium, Jun. 2007, pp. 79-82, IEEE.
Wohlmuth, Walter A. et al., "E-/D-pHEMT Technology for Wireless Components," Proceedings of the Compound Semiconductor Circuit Symposium, Oct. 2004, pp. 115-118, IEEE.
Notice of Allowance for U.S. Appl. No. 12/710,108 mailed Jan. 9, 2012, 8 pages.
Reines, I. et al., "Performance of Temperature-Stable RF MEMS Switched Capacitors under High RF Power Conditions," 2010 IEEE MTT-S International Microwave Symposium Digest (MTT), May 23-28, 2010, pp. 292-295, IEEE.
Notice of Allowance for U.S. Appl. No. 11/955,918 mailed Apr. 2, 2010, 9 pages.
Final Office Action for U.S. Appl. No. 11/955,918 mailed Jan. 8, 2010, 11 pages.
Non-final Office Action for U.S. Appl. No. 11/955,918 mailed Jun. 25, 2009, 14 pages.
Non-final Office Action for U.S. Appl. No. 12/709,979 mailed Feb. 17, 2012, 12 pages.
Non-final Office Action for U.S. Appl. No. 12/710,108 mailed Sep. 1, 2011, 6 pages.

* cited by examiner

THERMALLY NEUTRAL ANCHOR CONFIGURATION FOR AN ELECTROMECHANICAL ACTUATOR

RELATED APPLICATIONS

This application claims the benefit of provisional patent application Ser. No. 61/154,238, filed Feb. 20, 2009, and provisional patent application Ser. No. 61/156,965, filed Mar. 3, 2009, the disclosures of which are hereby incorporated herein by reference in their entireties. This application also relates to U.S. Pat. No. 8,354,901 entitled "Thermally Tolerant Anchor Configuration for a Circular Cantilever" and also to U.S. Pat. No. 8,314,467 entitled "Thermally Tolerant Electromechanical Actuators", both of which were concurrently filed on Feb. 22, 2010, the disclosures of which are hereby incorporated herein by reference in their entireties. This application further relates to U.S. Pat. No. 7,745,892 entitled "Integrated MEMS Switch", filed on Dec. 13, 2007, the disclosure of which is hereby incorporated by reference in its entirety.

FIELD OF THE DISCLOSURE

The present disclosure relates to RF MEMS switches, and in particular the stable volume manufacture of RF MEMS switches.

BACKGROUND

As electronics evolve, there is an increased need for miniature switches that are provided on semiconductor substrates along with other semiconductor components to form various types of circuits. These miniature switches often act as relays, and are generally referred to as micro-electromechanical system (MEMS) switches. MEMS switches generally include a moveable portion such as a cantilever, which has a first end anchored to the semiconductor substrate, and a second free end having a cantilever contact. When the MEMS switch is activated, the cantilever moves the cantilever contact against a substrate contact on the semiconductor substrate and under the cantilever contact.

Turning to FIGS. 1A and 1B, a semiconductor device 10 having a MEMS switch 12 is illustrated. The MEMS switch 12 is effectively formed on a semiconductor substrate 14. The MEMS switch 12 includes a cantilever 16, which is formed from a conductive material, such as gold. The cantilever 16 has a first end and a second end. The first end is coupled to the semiconductor substrate 14 by an anchor 18. The first end of the cantilever 16 is also electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26.

To actuate the MEMS switch 12, and in particular to cause the second end of the cantilever 16 to move the cantilever contact 22 into contact with the contact portion 24 of the second conductive pad 26, an actuator plate 28 is disposed over a portion of the semiconductor substrate 14 and under the middle portion of the cantilever 16. To actuate the MEMS switch 12, a potential difference is applied between the cantilever 16 and the actuator plate 28. The presence of this potential difference creates an electrostatic force that effectively moves the second end of the cantilever 16 toward the actuator plate 28, thus changing the position of the cantilever 16 from the position illustrated in FIG. 1A to the position illustrated in FIG. 1B.

Typically, the first conductive pad 20, the second conductive pad 26, and the actuator plate 28 are formed from a single metallic or conductive layer, such as gold, copper, platinum, or the like. The particular form factor for the first conductive pad 20, second conductive pad 26, and actuator plate 28 is provided through an etching or other patterning technique. With continued reference to FIGS. 1A and 1B, the MEMS switch 12 may be encapsulated by one or more encapsulating layers 30 and 32, which make up a wafer level package (WLP) around the MEMS switch 12. Moreover, the encapsulating layers 30 and 32 form a substantially hermetically sealed cavity about the cantilever 16. The cavity is generally filled with an inert gas. Once the encapsulation layers 30 and 32 are in place and any other semiconductor components are formed on the semiconductor substrate 14, a plastic overmold 34 may be provided over the encapsulation layers 30 and 32 and any other semiconductor components.

With continued reference to FIGS. 1A and 1B, the substrate 14 is preferably formed using a semiconductor-on-insulator process, such as a silicon- or sapphire-on-insulator process. In particular, the substrate 14 includes a handle wafer 36 that is formed from silicon, sapphire, glass, or like material to form a foundation layer for the semiconductor device 10. The handle wafer 36 is typically a few hundred microns thick. An insulator layer 38 is formed over the handle wafer 36. The insulator layer 38 is generally formed from an oxide, such as Silicon Dioxide ($SiO_2$), which may range in thickness from 0.1 to 2 microns in the preferred embodiment. A device layer 40, which may include one or more layers, is formed using an appropriate semiconductor material.

The device layer 40 is the layer or layers in which active semiconductor devices, such as transistors and diodes that employ PN junctions, are formed. The device layer 40 is initially formed as a base semiconductor layer that is subsequently doped with N-type and P-type materials to form the active semiconductor devices. Thus, the active semiconductor devices, except for any necessary contacts or connections traces, are generally contained within the device layer 40. Those skilled in the art will recognize various techniques for forming active semiconductor devices in the device layer 40. A metal-dielectric stack 42 is formed over the device layer 40, wherein a plurality of metal and dielectric layers are alternated to facilitate connection with and between the active devices formed in the device layer 40. Further, in the preferred embodiment the handle wafer 36 is made of a high-resistivity semiconductor material where resistance is greater than 50 ohm-cm.

With the present disclosure, active semiconductor devices may be formed in the device layer 40 and connected to one another via the metal-dielectric stack 42 directly underneath the MEMS switch 12. Since the device layer 40 resides over the insulator layer 38, high voltage devices, which may exceed ten (10) volts in operation, may be formed directly under the MEMS switch 12 and connected in a way to control operation of the MEMS switch 12 or associated circuitry. Although silicon is described in an exemplary embodiment, the semiconductor material for the device layer 40 may include gallium arsenide (GaAs), gallium nitride (GaN), indium phosphide (InP), silicon germanium (SiGe), sapphire, and like semiconductor materials. The device layer 40 typically ranges in thickness from 0.1 microns to 20 or more microns.

As illustrated in FIGS. 1A and 1B, a passivation layer 44 may be provided over the metal-dielectric stack 42. As may be best seen from the perspective view of FIG. 2, a metal layer used to form the first conductive pad 20, the second conductive pad 26, and the actuator plate 28 may be formed over the passivation layer 44 and etched to form the respective ones of the first conductive pad 20, the second conductive pad 26, and the actuator plate 28. Prior to packaging, the cantilever 16 is 'released' and is free to actuate or deform. In particular, the cantilever 16 may be released following formation of a small micro-cavity surrounding the MEMS switch 12. A sacrificial material such as polymethylglutarimide (PMGI) is etched away using wet etches. Following drying and cleaning of the MEMS switch 12, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 12 to an end-user laminate.

A problem of undesirable deformation of the MEMS switch 12 often occurs due to a significant difference in the coefficient of thermal expansion (CTE) between the metal comprising MEMS switch 12 and the semiconductor or insulator comprising passivation layer 44. The CTE of the metal making up the MEMS switch 12 often ranges from two to seven times larger than the CTE of the semiconductor or insulator making up the passivation layer 44. At room temperature (i.e., 25° C.), the difference in the CTE does not present a problem. However, during manufacture, assembly, or operation of the MEMS switch 12, the temperature of the MEMS switch 12 and the substrate 14 (FIGS. 1A and 1B) including the passivation layer 44 can range from 85° C. to 400° C. In such circumstances, particularly in the case of an ohmic contact switch function for MEMS switch 12, it is desirable to ensure that the cantilever contact 22 and second conductive pad 26 or passivation layer 44 do not make contact.

FIG. 3 illustrates how differences in CTE may lead to a thermally induced deformation of the cantilever 16. A plurality of dots shown in a side cross-section of the cantilever 16 and the anchor 18 represent individual metal domains making up the cantilever 16 and the anchor 18. As the MEMS switch 12 is heated during manufacturing and/or assembly, the metal domains migrate away from each other and thereby producing a deflection force on the cantilever 16. The deflection force is represented by an arrow at the free end of the cantilever 16. In this case, the deflection force urges the cantilever towards the passivation layer 44.

FIG. 4 depicts the results of a finite element simulation of the mechanical effects experienced by the MEMS switch 12 when the MEMS switch 12 is heated to a steady state temperature of 300° C. The finite element simulation shows when the MEMS switch 12 reaches a temperature of 300° C., the cantilever 16 will have rotated enough that the cantilever contact 22 will be in contact with the second conductive pad 26. MEMS switch 12 has a switch open state that typically maintains a one-half micrometer gap between the cantilever contact 22 and the second conductive pad 26. Further finite element simulations show that the deflection of the cantilever 16 may allow the cantilever contact 22 to traverse gap distances that exceed one-half micrometer.

Notice that a rotational axis 46 of the cantilever 16 is perpendicular to a longitudinal axis 48 of the cantilever 16. As suggested by the finite element simulations, the elevated temperatures experienced by the MEMS switch 12 during manufacturing, assembly, or operation, the cantilever 16 may be thermally deflected to rotate about the rotational axis 46. As the temperature of the MEMS switch 12 increases, the rotation of cantilever 16 may become so pronounced that the cantilever contact 22 will contact the second conductive pad 26. An adhesion between the cantilever contact 22 and the second conductive pad 26 may prevent the cantilever contact 22 and the second conductive pad 26 from breaking contact as the temperature of the MEMS switch 12 decreases. A failure to break contact between the cantilever contact 22 and the second conductive pad 26 will result in a failed MEMS switch along with a failed product incorporating the MEMS switch 12.

Significant yield loss, which may approach 80%, may be attributed to this thermally induced actuation during manufacture of devices with this kind of standard attachment configuration. Thus, the need for a structure which can prevent this kind of thermal actuation is apparent.

SUMMARY OF THE DISCLOSURE

An embodiment of the present disclosure relates to the physical and geometric configuration of the attachment between the movable part of an electromechanical actuator and its underlying substrate. A configuration where the major axis of this attachment is parallel to the major axis of the actuator spring or plate will significantly reduce thermally induced deformation.

In particular, an embodiment of the present disclosure is a micro-mechanical systems (MEMS) switch having a thermally neutral anchor configuration. The disclosed MEMS switch includes a substrate onto which a first conductive pad and a second conductive pad are formed. A first conductive pad anchor is coupled to the first conductive pad and a second conductive anchor spaced from the first conductive anchor is also coupled to the first conductive pad. A conductive cantilever beam has a first end portion that is situated between and coupled to the first and second conductive anchors. Moreover, the conductive cantilever beam has a second end portion that is suspended over the second conductive pad, and a middle portion between the first end portion and the second end portion. The MEMS switch also includes a conductive actuator plate formed on the substrate at a location beneath the middle portion of the conductive cantilever beam and between the first and second conductive pads.

In operation, a potential difference applied between the conductive cantilever beam and the actuator plate urges the conductive cantilever beam to deflect towards the substrate such that electrical contacts located on the second end portion of the cantilever beam come into contact with the second conductive pad. When the potential difference applied between the conductive cantilever beam and the actuator is eliminated, the conductive cantilever beam deflects away from the substrate back to its nominal rest position such that the electrical contacts break contact with the second conductive pad.

As a result of the unique anchor configuration of the disclosed MEMS switch, the second end of the conductive cantilever beam deflects less than 0.05 micrometers (μm) from a de-actuated position at 25° C. over a temperature range of −100° C. to 300° C. due to thermal expansion or thermal contraction of the conductive cantilever beam and/or the first and second conductive anchors.

Those skilled in the art will appreciate the scope of the present disclosure and realize additional aspects thereof after reading the following detailed description in association with the accompanying drawings.

BRIEF DESCRIPTION OF THE DRAWING FIGURES

The accompanying drawing figures incorporated in and forming a part of this specification illustrates several aspects of the invention and together with the description serve to explain the principles of the invention.

DETAILED DESCRIPTION

In a typical anchor and cantilever beam attachment configuration, an axis of attachment is perpendicular to the longitudinal axis of the cantilever beam the anchor is holding. Embodiments of the present disclosure rotate the attachment axis by 90 degrees splitting the anchor into two new spaced anchors such that two new attachment axes become substantially parallel to the longitudinal axis of the cantilever beam. During the high temperature environment the attachment axes become rotation axes for mechanically strained portions of the anchors and cantilever beam. However, due to the rotation axes being spaced apart and parallel, the thermally induced strain urge deflection of the mechanically strained portions against each other. In this way, thermal expansion of the anchor and cantilever beam will not urge a tip of the cantilever beam to deflect significantly. As a result, manufacturing yield of MEMS switches incorporating the disclosed anchor configuration will be improved.

Figure 1A:
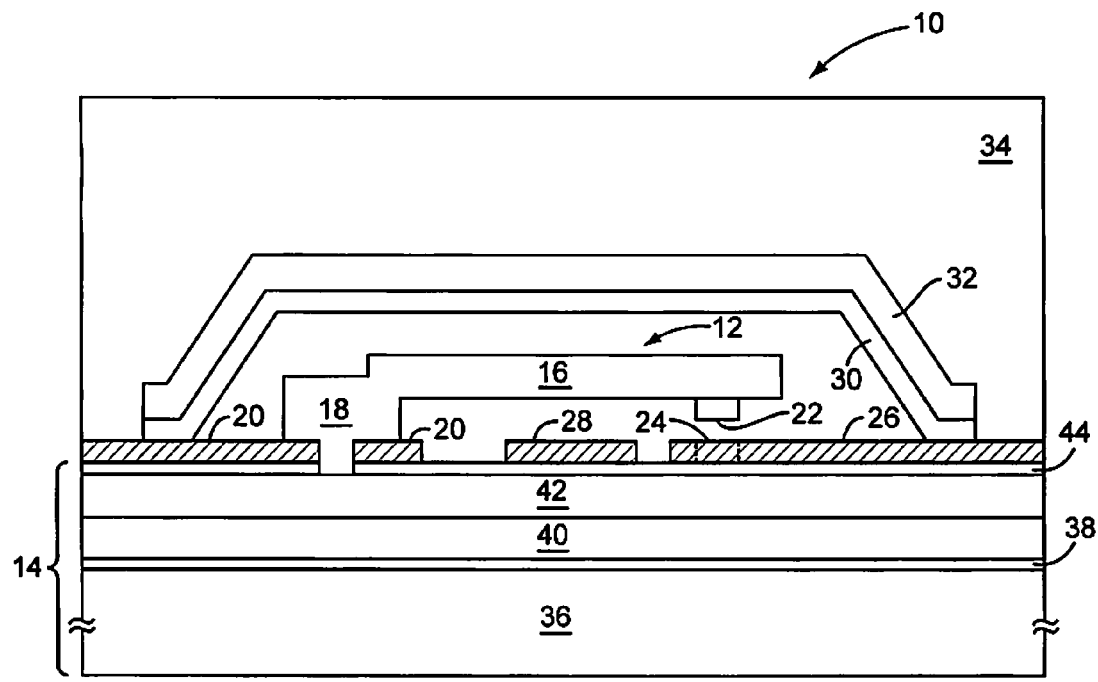
FIGS. 1A and 1B illustrate an exemplary micro-electromechanical systems (MEMS) switch in an open and closed position respectively.
Figure 1B:
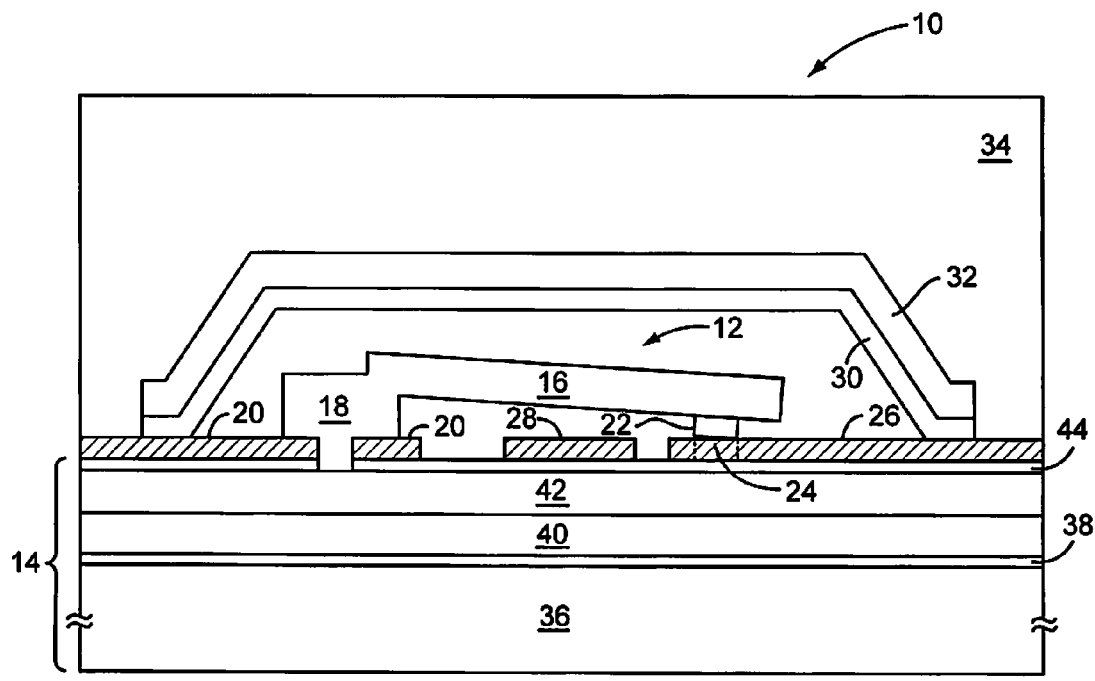
Figure 2:
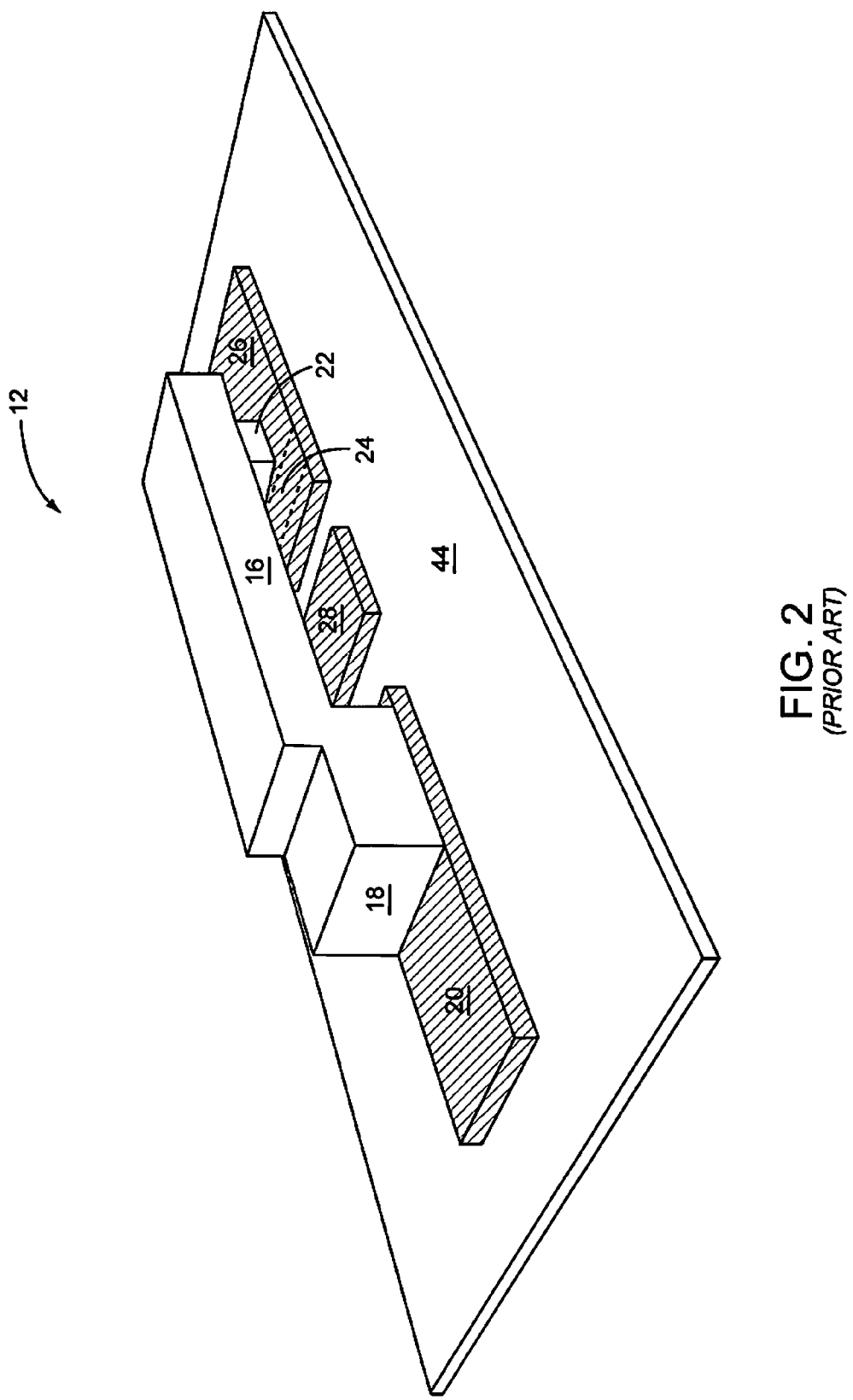
FIG. 2 is a perspective view of a portion of the MEMS switch of FIGS. 1A and 1B.
Figure 3:
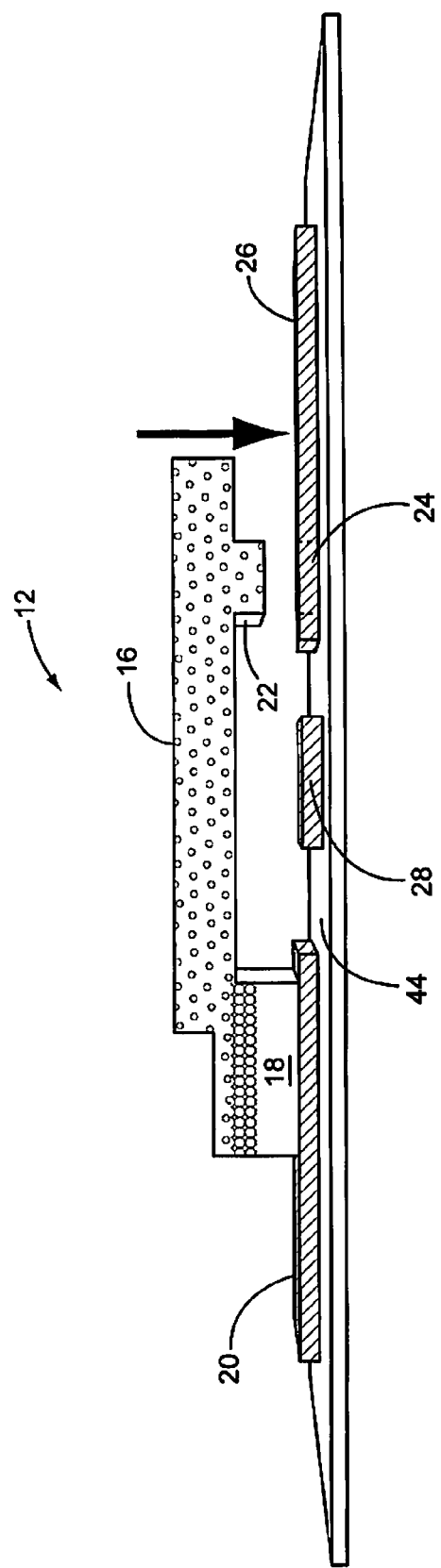
FIG. 3 illustrates the thermally induced mechanical stress in the MEMS switch during manufacturing.
Figure 4:
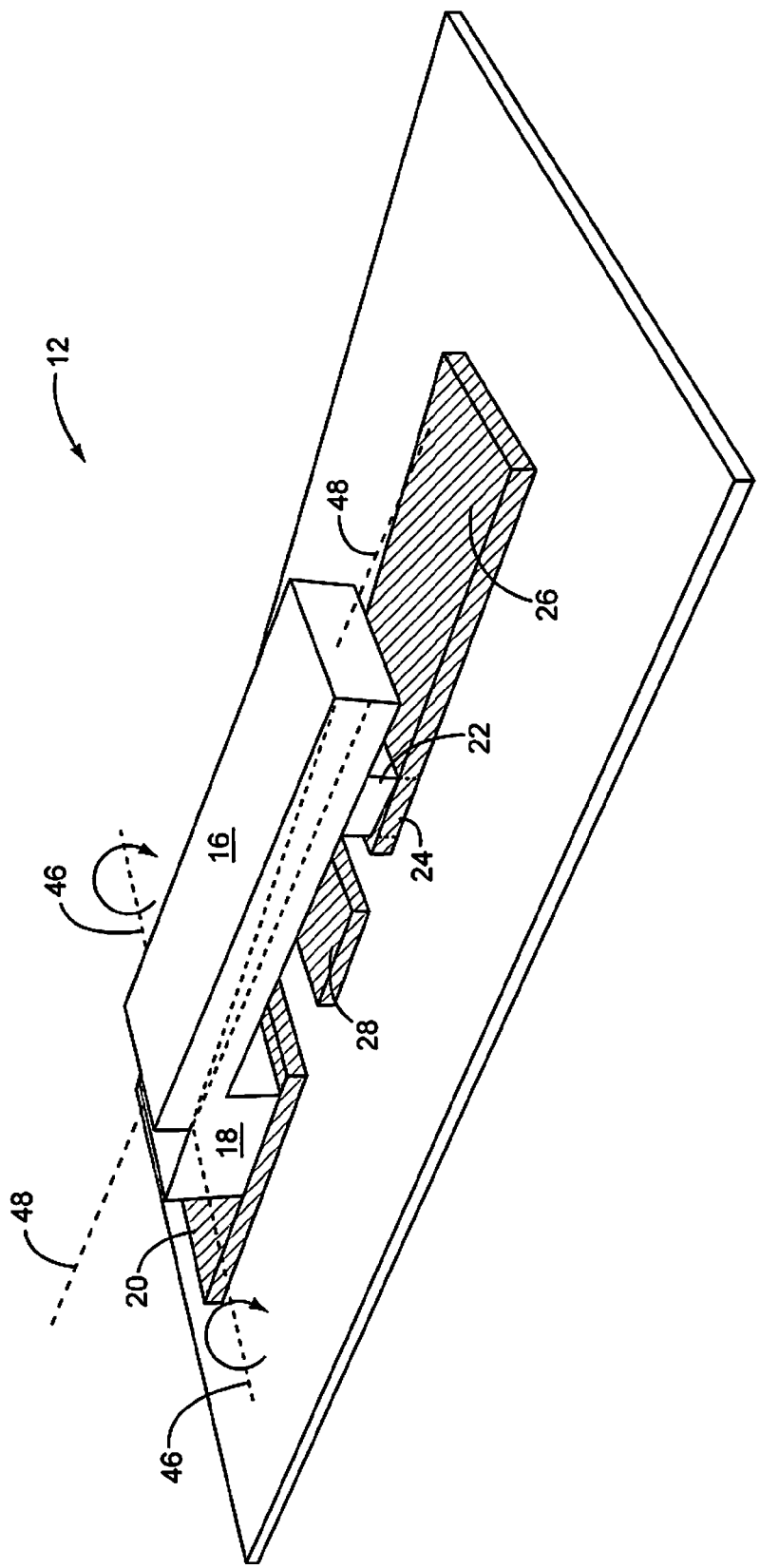
FIG. 4 depicts the failure of the MEMS switch as a result of the thermally induced mechanical stress illustrated in FIG. 3.
Figure 5:
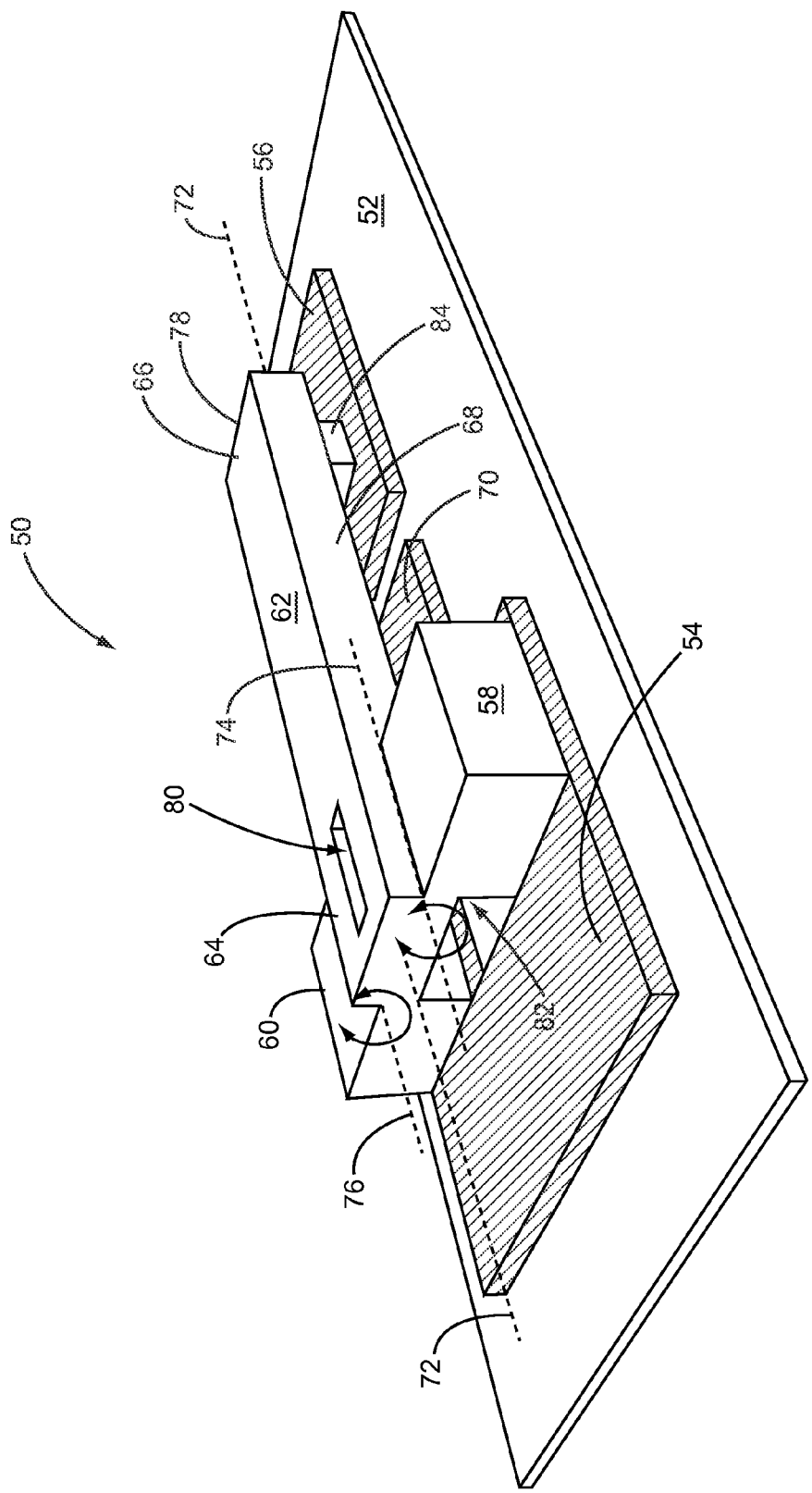
FIG. 5 depicts an embodiment of a MEMS switch according to the present disclosure.

FIG. 5 depicts a micro-electromechanical systems (MEMS) switch 50 that is structured according the present disclosure. The MEMS switch 50 includes a substrate 52 onto which a first conductive pad 54 and a second conductive pad 56 are formed. A first conductive anchor 58 is coupled to the first conductive pad 54. A second conductive anchor 60 is spaced from the first conductive anchor 58 and is also coupled to the first conductive pad 54. A conductive cantilever beam 62 has a first end portion 64 that is situated between and coupled to both the first conductive anchor 58 and the second conductive anchor 60. The configuration of the first conductive anchor 58 and second conductive anchor 60 is referred to in this disclosure as a side anchors configuration. A second end portion 66 of the conductive cantilever beam 62 is suspended over the second conductive pad 56 and a middle portion 68 between the first end portion 64 and the second end portion 66. A conductive actuator plate 70 is formed onto the substrate 52 at a location beneath the middle portion 68 of the conductive cantilever beam 62 and between the first conductive pad 54 and the second conductive pad 56.

Continuing with FIG. 5, the conductive cantilever beam 62 has a longitudinal axis 72. During thermal expansion of the conductive cantilever beam 62, a first rotation axis 74 and a second rotation axis 76 are formed between the first conductive anchor 58 and first end portion 64 as well as between the second conductive anchor 60 and first end portion 64, respectively. The first rotation axis 74 and the second rotation axis 76 are parallel to the longitudinal axis 72. As a result, a tip 78 of the conductive cantilever beam 62 does not deflect downward enough to allow any part of the conductive cantilever beam 62 to come into contact with either the second conductive pad 56, or the conductive actuator plate 70, or the substrate 52 due to thermal expansion alone during manufacturing or operation.

A stress relief slot 80 formed within the first end portion 64 of the conductive cantilever beam 62 partially extends along the longitudinal axis 72. The stress relief slot 80 provides mechanical strain relief as portions of the first end portion 64 of the conductive cantilever beam 62 are urged to partially rotate about each of the first rotation axis 74 and the second rotation axis 76 towards the substrate 52 during thermal expansion of the conductive cantilever beam 62, and the first conductive anchor 58 and the second conductive anchor 60. Moreover, a bottom surface 82 of the first end portion 64 of the conductive cantilever beam 62 is spaced above at least a portion of the substrate 52 that resides below the first end portion 64 of the conductive cantilever beam 62. The space between the bottom surface 82 of the first end portion 64 and the at least a portion of the substrate 52 further allows portions of the conductive cantilever beam 62 to provide mechanical strain relief as portions of the first end portion 64 of the conductive cantilever beam 62 are urged to partially rotate about each of the first rotation axis 74 and second rotation axis 76 respectively.

Figure 6:
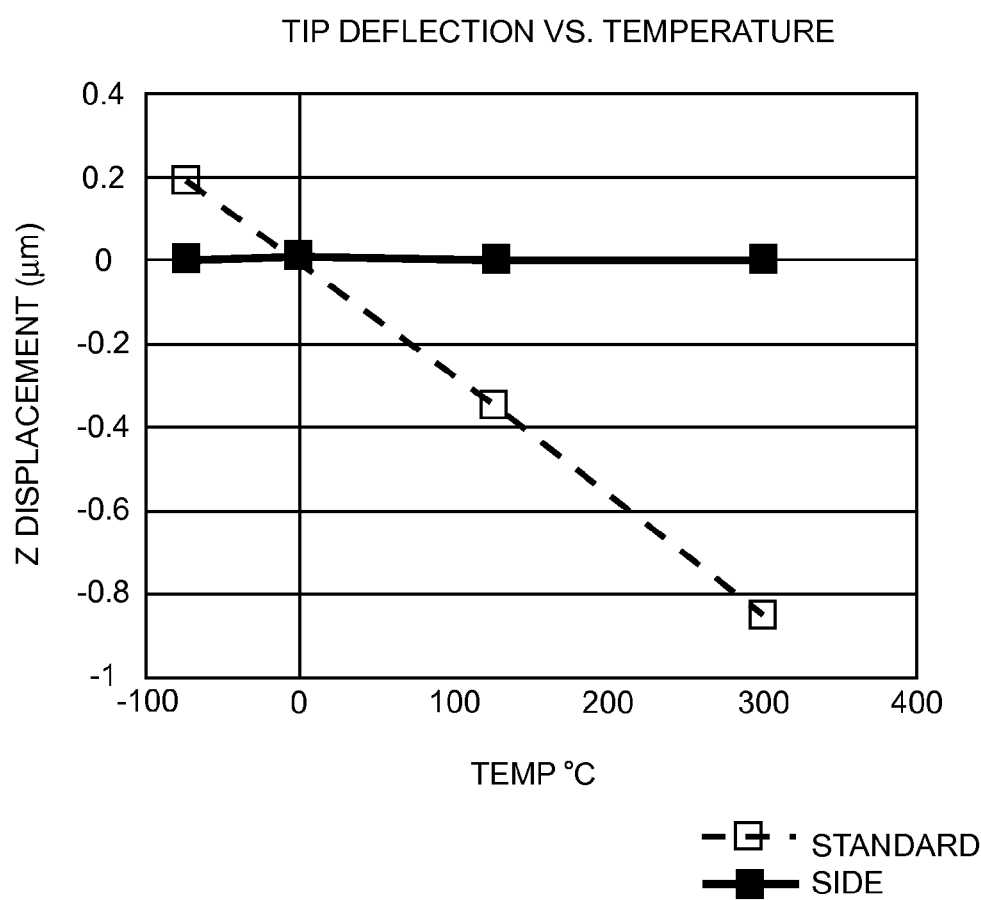
FIG. 6 is a graph depicting an improvement in cantilever tip deflection over a standard MEMS switch exposed to the thermal environment of a MEMS manufacturing process.

By allowing thermally induced mechanical stress to be relieved about the first rotation axis 74 and the second rotation axis 76, the tip 78 of the second end portion 66 is not urged to deflect enough to allow an electrical contact 84 or any part of the conductive cantilever beam 62 to come into contact with either the second conductive pad 56, or the conductive actuator plate 70, or the substrate 52 due to thermal expansion alone during manufacturing or operation. In fact, the deflection of the tip 78 due to thermal expansion alone may be considered neutral as illustrated by FIG. 6, which is a graph depicting an improvement in cantilever beam tip deflection over a standard MEMS switch. As depicted in FIG. 6, a standard tip deflection response is graphed with a dashed line. A tip of a MEMS switch labeled STANDARD deflects downwardly at least 0.8 micrometers (μm) due to the thermal expansion of the MEMS while being exposed to a 300° C. temperature during manufacturing.

A MEMS switch having a tip deflection of 0.8 μm due to thermal expansion can lead to a failure of the MEMS switch during high temperature steps in manufacturing or assembly due to adhesion between fixed and movable portions of the device. In contrast, a MEMS switch having the side anchors configuration of the MEMS switch 50 (FIG. 5) has a tip deflection response that relatively neutral, which means that the tip 78 (FIG. 5) will not deflect significantly due to thermal expansion of portions of MEMS switch 50. A solid line labeled SIDE and depicted in the graph of FIG. 6 shows a tip deflection that is less than plus or minus 0.05 µm over a temperature range of −75° C. to 300° C. As a result, a MEMS switch having the side anchors configuration of the present disclosure is not likely to fail due to tip deflection during thermal expansion during exposure to manufacturing and operational temperature ranges.

Figure 7A:
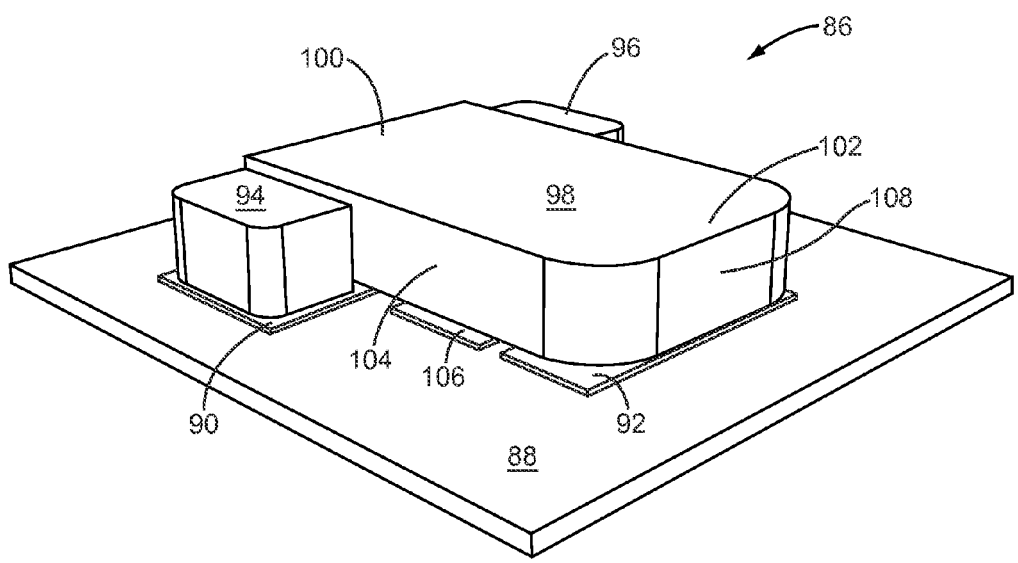
FIGS. 7A and 7B illustrate a thermally induced mechanical stress on a MEMS switch manufactured in accordance with the present disclosure.
Figure 7B:
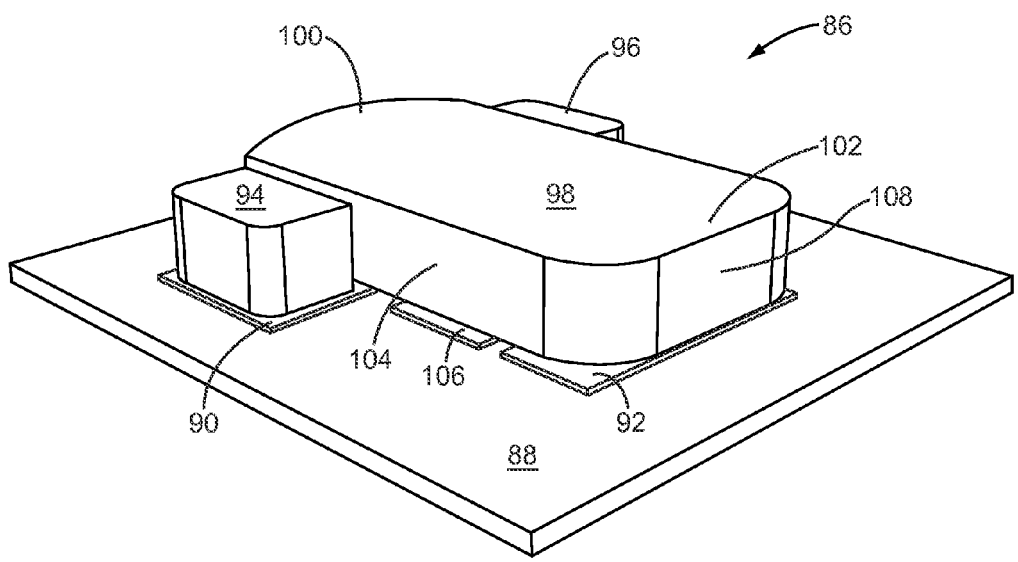

FIGS. 7A and 7B illustrate a thermally induced mechanical stress on another embodiment of a MEMS switch 86 that is configured in accordance with the present disclosure. The MEMS switch 86 includes a substrate 88 onto which a first conductive pad 90 and a second conductive pad 92 are formed. A first conductive anchor 94 is coupled to the first conductive pad 90. A second conductive anchor 96 is spaced from the first conductive anchor 94 and is also coupled to the first conductive pad 90. A conductive cantilever beam 98 has a first end portion 100 that is situated between and coupled to both the first conductive anchor 94 and the second conductive anchor 96. A second end portion 102 of the conductive cantilever 98 is suspended over the second conductive pad 92 and a middle portion 104 between the first end portion 100 and the second end portion 102. A conductive actuator plate 106 is formed onto the substrate 88 at a location beneath the middle portion 104 of the conductive cantilever beam 98 and between the first conductive pad 90 and the second conductive pad 92.

FIG. 7A depicts the MEMS switch 86 at an open switch position while at a temperature of 25° C. Notice that the first end portion 100 of the conductive cantilever beam 98 is relatively flat at 25° C. and that there is no deflection of a tip 108 of the conductive cantilever beam 98. In comparison, FIG. 7B depicts the MEMS switch 86 at the open switch position while having been heated to a temperature of around 300° C. Notice that the end portion 100 of the conductive cantilever beam 98 is bulging outwardly away from the substrate 88. However, the tip 108 of the conductive cantilever beam 98 is substantially undeflected towards the second conductive pad 92 thereby potentially preventing a failure of MEMS switch 86 due to adhesion between conductive pad 92 and portions of the tip 108.

There are at least two reasons that the end portion 100 of the conductive cantilever beam 98 is urged to bulge outwardly away from the substrate 88 while being heated during manufacturing or operation. First, a coefficient of thermal expansion (CTE) for the first conductive anchor 94, the second conductive anchor 96, and the conductive cantilever beam 98 have a coefficient of CTE that is on the order of seven times greater than a CTE for the substrate 88. Secondly, the first conductive anchor 94 and the second conductive anchor 96 are fixed to the first conductive pad 90, which in turn is fixed to the substrate 88. Since the first conductive anchor 94 and the second conductive anchor 96 have a fixed relationship to the substrate 88, the first conductive anchor 94 and the second conductive anchor 96 are urged to expand into the first end section 100 of the conductive cantilever beam 98. Therefore, the first end section 100 is urged to bulge outwardly away from substrate 88 as shown in FIG. 7B.

Figure 8A:
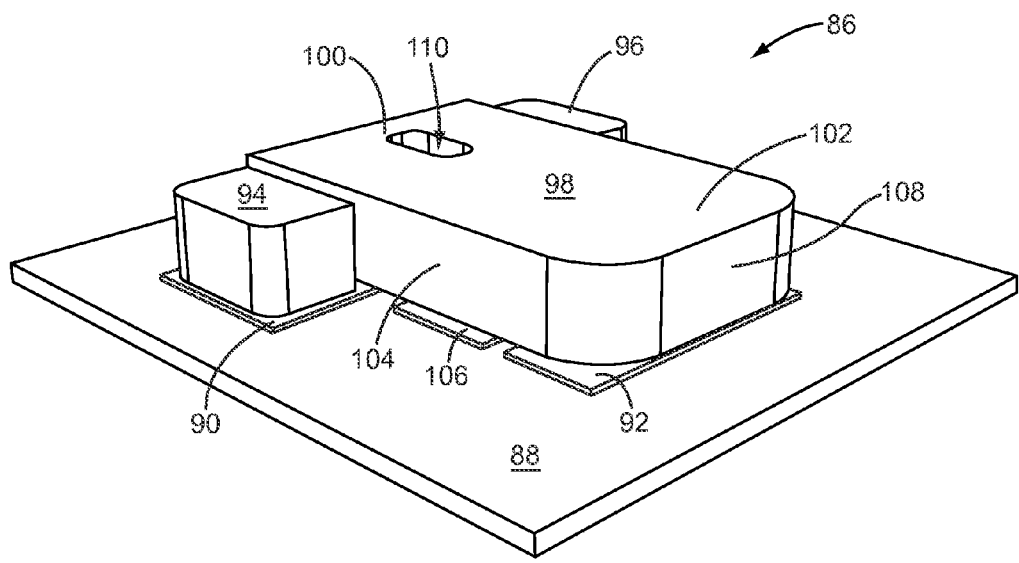
FIGS. 8A and 8B illustrate a strain relief action of a stress relief slot formed in the first end portion of the MEMS switch depicted in FIGS. 7A and 7B.
Figure 8B:
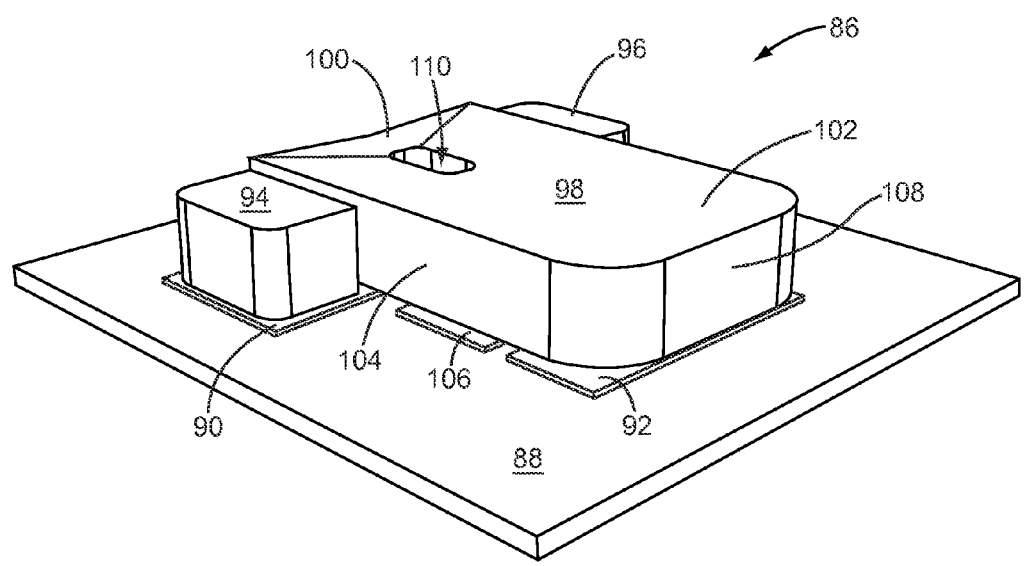

FIG. 8A depicts MEMS switch 86 with a stress relief slot 110 formed within the first end portion 100 of the conductive cantilever beam 98. FIG. 8A also represents the physical state of MEMS switch 86 at 25° C. Notice that the first end portion 100 and the tip 108 of the conductive cantilever beam 98 are not deflected. In comparison, FIG. 8B represents the physical state of MEMS switch 86 at 300° C. At this significantly higher temperature, the strain relief slot 110 allows the first end portion 100 of the conductive cantilever beam 98 to buckle slightly inwardly towards strain relief slot 110. As a result, the tip 108 of the conductive cantilever beam 98 deflects slightly away from substrate 88.

Figure 9:
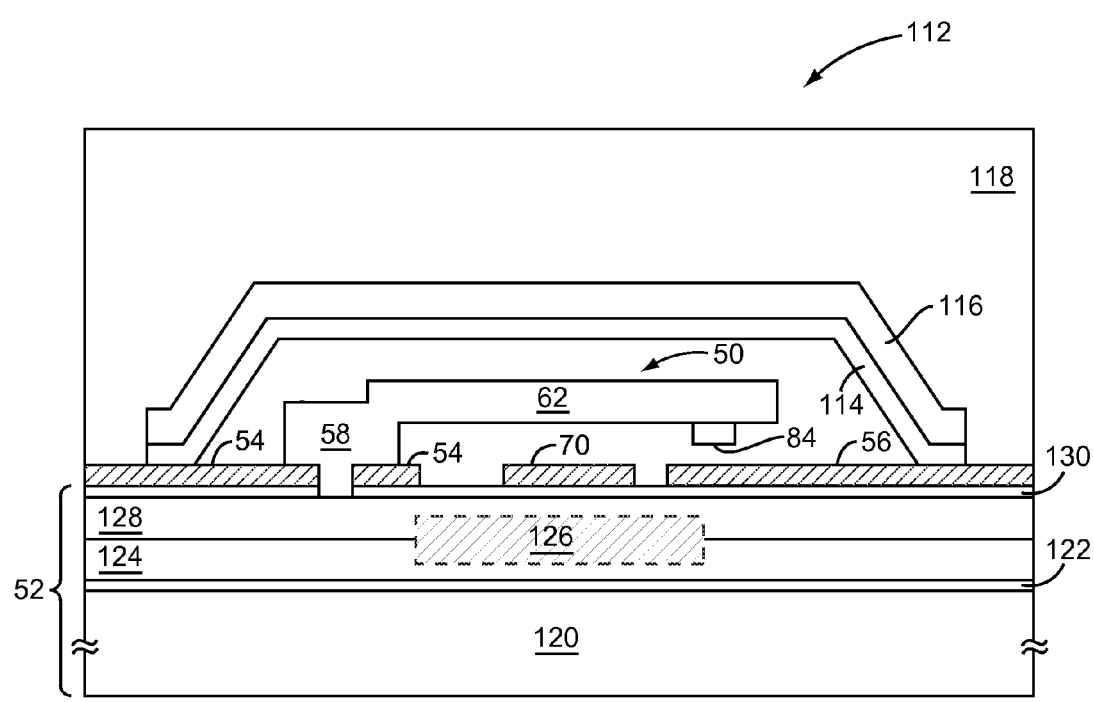
FIG. 9 depicts a MEMS switch integrated into a semiconductor device in accordance with the present disclosure.

Turning now to FIG. 9, a semiconductor device 112 incorporating the MEMS switch 50 (FIG. 5) is disclosed. The MEMS switch 50 may be encapsulated by one or more encapsulating layers 114 and 116, which make up a wafer level package (WLP) around the MEMS switch 50. Moreover, the encapsulating layers 114 and 116 form a substantially hermetically sealed cavity about the conductive cantilever beam 62. The cavity is generally filled with an inert gas. Once the encapsulation layers 114 and 116 are in place and any other semiconductor components are formed on the semiconductor substrate 52, a plastic overmold 118 may be provided over the encapsulation layers 114 and 116 and any other semiconductor components.

With continued reference to FIG. 9, the substrate 52 is preferably formed using a semiconductor-on-insulator process, such as a silicon- or sapphire-on-insulator process. In particular, the substrate 52 includes a handle wafer 120 that is formed from silicon, sapphire, glass, or like material to form a foundation layer for the semiconductor device 112. The handle wafer 120 is typically a few hundred microns thick. An insulator layer 122 is formed over the handle wafer 120. The insulator layer 122 is generally formed from an oxide, such as Silicon Dioxide ($SiO_2$), which may range in thickness from 0.1 to 2 microns in the preferred embodiment. A device layer 124, which may include one or more layers, is formed using an appropriate semiconductor material.

The device layer 124 is the layer or layers in which a plurality of active semiconductor devices 126, such as transistors and diodes that employ PN junctions, are formed. The plurality of active semiconductor devices may be formed using a complementary metal oxide semiconductor (CMOS) fabrication process. The device layer 124 is initially formed as a base semiconductor layer that is subsequently doped with N-type and P-type materials to form the active semiconductor devices. Thus, the active semiconductor devices, except for any necessary contacts or connections traces, are generally contained within the device layer 124. Those skilled in the art will recognize various techniques for forming active semiconductor devices in the device layer 124. A metal-dielectric stack 128 is formed over the device layer 124, wherein a plurality of metal and dielectric layers are alternated to facilitate connection with and between the active devices formed in the device layer 124. Further, in the preferred embodiment the handle wafer 120 is made of a high-resistivity semiconductor material where resistance is greater than 50 ohm-cm.

With the present disclosure, the plurality of active semiconductor devices 126 may be formed in the device layer 124 and connected to one another via the metal-dielectric stack 128 directly underneath the MEMS switch 50. Since the device layer 124 resides over the insulator layer 122, high voltage devices, which may exceed ten (10) volts in operation, may be formed directly under the MEMS switch 50 and connected in a way to control operation of the MEMS switch 50 or associated circuitry. Although silicon is described in the preferred embodiment, the semiconductor material for the device layer 124 may include gallium arsenide (GaAs), gallium nitride (GaN), indium phosphide (InP), silicon germanium (SiGe), sapphire, and like semiconductor materials. The device layer 124 typically ranges in thickness from 0.1 microns to 20 or more microns.

As illustrated in FIG. 9, a passivation layer 130 may be provided over the metal-dielectric stack 128. A metal layer used to form the first conductive pad 54, the second conductive pad 56, and the conductive actuator plate 70 may be formed over the passivation layer 130 and etched to form the respective ones of the first conductive pad 54, the second conductive pad 56, and the conductive actuator plate 70. Prior to packaging, the conductive cantilever beam 62 is 'released' and is free to actuate or deform. In particular, the conductive cantilever beam 62 may be released following formation of a small micro-cavity surrounding the MEMS switch 50. A sacrificial material such as polymethylglutarimide (PMGI) is etched away using wet etches. Following drying and cleaning of the MEMS switch 50, a dielectric is used to hermetically seal the micro-cavity. The deposition temperature for the dielectric is typically 250° C. Later in the manufacturing process, the device can experience multiple exposures to 260° C. solder reflow during attachment of a module incorporating the MEMS switch 50 to an end-user laminate.

Thermally induced yield loss of MEMS switches during manufacture of the semiconductor device 112 incorporating the MEMS switch 50 (FIG. 5) or MEMS switch 86 (FIGS. 8A, and 8B) having side anchor configurations are significantly lower. In fact, the disclose side anchor attachment configuration reduces a percentage of MEMS switch failures due to thermally induced tip deflection in a wafer level package (WLP) protected MEMS switch by a factor of two. Factors other than thermally induced tip deflection account for other MEMS switch failures.

Figure 10:
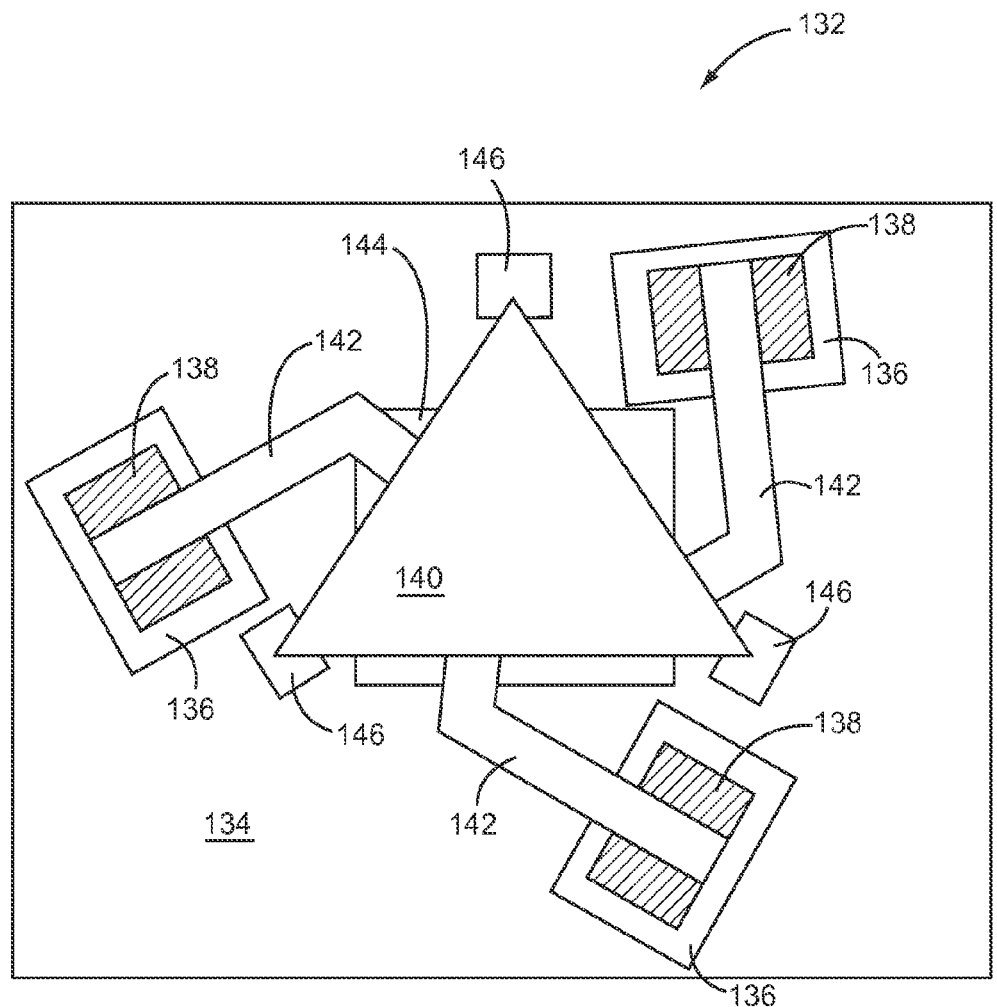
FIG. 10 is an embodiment of a MEMS switch having a plurality of anchors without a cantilever beam.

FIG. 10 depicts a MEMS switch 132 that does not employ a cantilever beam. In this embodiment, the MEMS switch 132 includes a substrate 134 onto which a first plurality of conductive pads 136 is formed. A plurality of conductive anchors 138 are individually coupled to the conductive pads 136. A conductive plate 140 is carried by a plurality of conductive arms 142. A conductive actuator plate 144 is formed on the substrate 134 underneath the conductive plate 144. A second plurality of conductive pads 146 is formed adjacent to conductive plate 140, such that electrical connection between the conductive plate 140 and the plurality of second conductive pads may be made when the activator plate 144 is energized to urge conductive plate 140 towards the substrate 134. The conductive plate 140 does not make contact with the activator plate 144 when the activator plate 144 is energized.

Those skilled in the art will recognize improvements and modifications to the preferred embodiments of the present disclosure. For example, the anchors in the disclosed embodiments could be coupled directly to a substrate instead of being coupled to conductive pads formed on the substrate. Conductive vias could be used to couple electrical signals to the anchors. All such improvements and modifications are considered within the scope of the concepts disclosed herein and the claims that follow.

What is claimed is:

1. A micro-electromechanical systems (MEMS) switch having a thermally neutral anchor configuration comprising:
    a substrate;
    a first conductive anchor coupled to the substrate;
    a second conductive anchor spaced from the first conductive anchor and coupled to the substrate;
    a conductive cantilever beam having a first end portion situated between and coupled to the first conductive anchor and the second conductive anchor, a second end portion suspended over the substrate, and a middle portion between the first end portion and the second end portion; and
    a conductive actuator plate formed on the substrate at a location beneath the middle portion of the conductive cantilever beam; and
    wherein the conductive cantilever beam has a longitudinal axis and wherein:
        a first rotation axis for the conductive cantilever beam is formed between the first conductive anchor and the first end portion of the conductive cantilever beam and
        a second rotation axis for the conductive cantilever beam is formed between the second conductive anchor and the first end portion of the conductive cantilever beam during thermal expansion of:
        the conductive cantilever beam and
        the first conductive anchor and
        the second conductive anchor,
    wherein the first and second rotation axes are parallel to the longitudinal axis of the conductive cantilever beam.

2. The MEMS switch of claim 1 wherein the first end portion of the conductive cantilever beam includes a slot for relieving mechanical stresses within the conductive cantilever beam during thermal expansion of the conductive cantilever beam and the first conductive anchor and the second conductive anchor.

3. The MEMS switch of claim 1 wherein the first end portion of the conductive cantilever beam includes a slot for relieving mechanical stresses within the conductive cantilever beam during the thermal expansion of the conductive cantilever beam and the first conductive and the second conductive anchors.

4. The MEMS switch of claim 1 further including a bottom surface of the first end portion of the conductive cantilever beam that is spaced above at least a portion of the substrate that resides below the first end portion of the conductive cantilever beam.

5. A semiconductor device comprising:
    a substrate comprising a handle layer, an insulator layer over the handle layer, and a device layer over the handle layer in which a plurality of active semiconductor devices are formed; and
    a micro-electromechanical systems (MEMS) switch integrally formed on the substrate, the MEMS switch comprising:
        a first conductive anchor coupled to the substrate;
        a second conductive anchor spaced from the first conductive anchor and coupled to the substrate;
        a conductive cantilever beam having a first end portion situated between and coupled to the first conductive anchor and the second conductive anchor, a second end portion suspended over the substrate, and a middle portion between the first end portion and the second end portion; and
        a conductive actuator plate formed on the substrate at a location beneath the middle portion of the conductive cantilever beam; and
        wherein the conductive cantilever beam has a longitudinal axis and wherein:
            a first rotation axis for the conductive cantilever beam is formed between the first conductive anchor and the first end portion of the conductive cantilever beam and
            a second rotation axis for the conductive cantilever beam is formed between the second conductive anchor and the first end portion of the conductive cantilever beam during thermal expansion of:
            the conductive cantilever beam and
            the first conductive anchor and
            the second conductive anchor,
        wherein the first and second rotation axes are parallel to the longitudinal axis of the conductive cantilever beam.

6. The semiconductor device of claim 5 wherein the first end portion of the conductive cantilever beam includes a slot for relieving mechanical stresses within the conductive cantilever beam during thermal expansion of the conductive cantilever beam and the first conductive anchor and the second conductive anchor.

7. The semiconductor device of claim 5 wherein the first end portion of the conductive cantilever beam includes a slot for relieving mechanical stresses within the conductive cantilever beam during the thermal expansion of the conductive cantilever beam and the first conductive anchor and the second conductive anchor.

8. The semiconductor device of claim 5 further including a bottom surface of the first end portion of the conductive cantilever beam that is spaced above at least a portion of the substrate that resides below the first end portion of the conductive cantilever beam.

9. The semiconductor device of claim 5 further comprising an overmold covering the MEMS switch and the substrate, wherein an integrated module comprising the plurality of active semiconductor devices and the MEMS switch is formed.

10. The semiconductor device of claim 5 further comprising:
   a multilayer encapsulation structure forming an enclosure about the first conductive anchor, the second conductive anchor, the conductive cantilever beam and the conductive actuator plate; and
   an overmold covering the MEMS switch and the substrate, wherein an integrated module comprising the plurality of active semiconductor devices is formed.

11. The semiconductor device of claim 10 wherein a space encapsulated by the multilayer encapsulation structure is gas filled.

12. The semiconductor device of claim 5 wherein the device layer comprises silicon and the plurality of active semiconductor devices is formed using a complementary metal oxide semiconductor (CMOS) fabrication process.

13. A micro-electromechanical systems (MEMS) switch having a thermally neutral anchor configuration comprising:
   a substrate;
   a conductive actuator plate formed on the substrate;
   a plurality of conductive anchors being individually coupled to the substrate;
   a conductive plate being carried above the substrate by a plurality of conductive arms that are coupled to the plurality of conductive anchors; and
   at least one conductive pad being formed adjacent to the conductive plate such that electrical connection between the conductive plate and the at least one conductive pad can be made when the conductive actuator plate is energized to urge the conductive plate towards the substrate; and
   wherein the conductive plate has a longitudinal axis and wherein:
      a first rotation axis for the conductive plate is formed between a first conductive anchor of the plurality of conductive anchors and a first end portion of the conductive plate and
      a second axis for the conductive plate is formed between a second of the plurality of conductive anchors and the first end portion of the conductive plate during thermal expansion of;
         the conductive plate and
         the first conductive anchor and
         the second conductive anchor,
      wherein the first and second rotation axes are parallel to the longitudinal axis of the conductive plate.

* * * * *